United States Patent [19]

Welles, II et al.

[11] Patent Number: 4,603,300

[45] Date of Patent: Jul. 29, 1986

[54] FREQUENCY MODULATION DETECTOR USING DIGITAL SIGNAL VECTOR PROCESSING

[75] Inventors: Kenneth B. Welles, II, Schenectady; Sharbel E. Noujaim, Clifton Park, both of N.Y.

[73] Assignee: General Electric Company, Schenectady, N.Y.

[21] Appl. No.: 653,119

[22] Filed: Sep. 21, 1984

[51] Int. Cl.[4] .............................................. H03D 3/00
[52] U.S. Cl. .................................... 329/50; 329/124; 329/126; 375/82; 455/214
[58] Field of Search ............... 329/50, 122, 124, 126; 455/214; 375/80, 82, 94

[56] References Cited

FOREIGN PATENT DOCUMENTS 2113930   8/1983   United Kingdom ................ 329/124

*Primary Examiner*—Siegfried H. Grimm
*Attorney, Agent, or Firm*—Marvin Snyder; James C. Davis, Jr.

[57] ABSTRACT

A frequency modulated signal is converted into a pair of baseband signals by mixing the signal with a pair of phase-quadrature reference signals of substantially carrier center frequency. The double reference frequency component of each of the baseband signals is filtered to obtain I and Q signals. The I and Q signals constitute in rectangular coordinates the components of a vector represented in polar coordinates by R and $\theta$ where R is the maximum amplitude of the I and Q signals and $\theta$ is the instantaneous angle represented by the arctangent of the I signal divided by the Q signal. The I and Q signals are sampled to provide a sequence of sets of signal samples. For each set of signal samples the angle $\theta$ is obtained. A sequence of changes in the values of the angle $\theta$ over successive sampling periods is obtained and represents the deviation in frequency of the FM carrier corresponding to changes in amplitude of the modulating signal.

5 Claims, 10 Drawing Figures

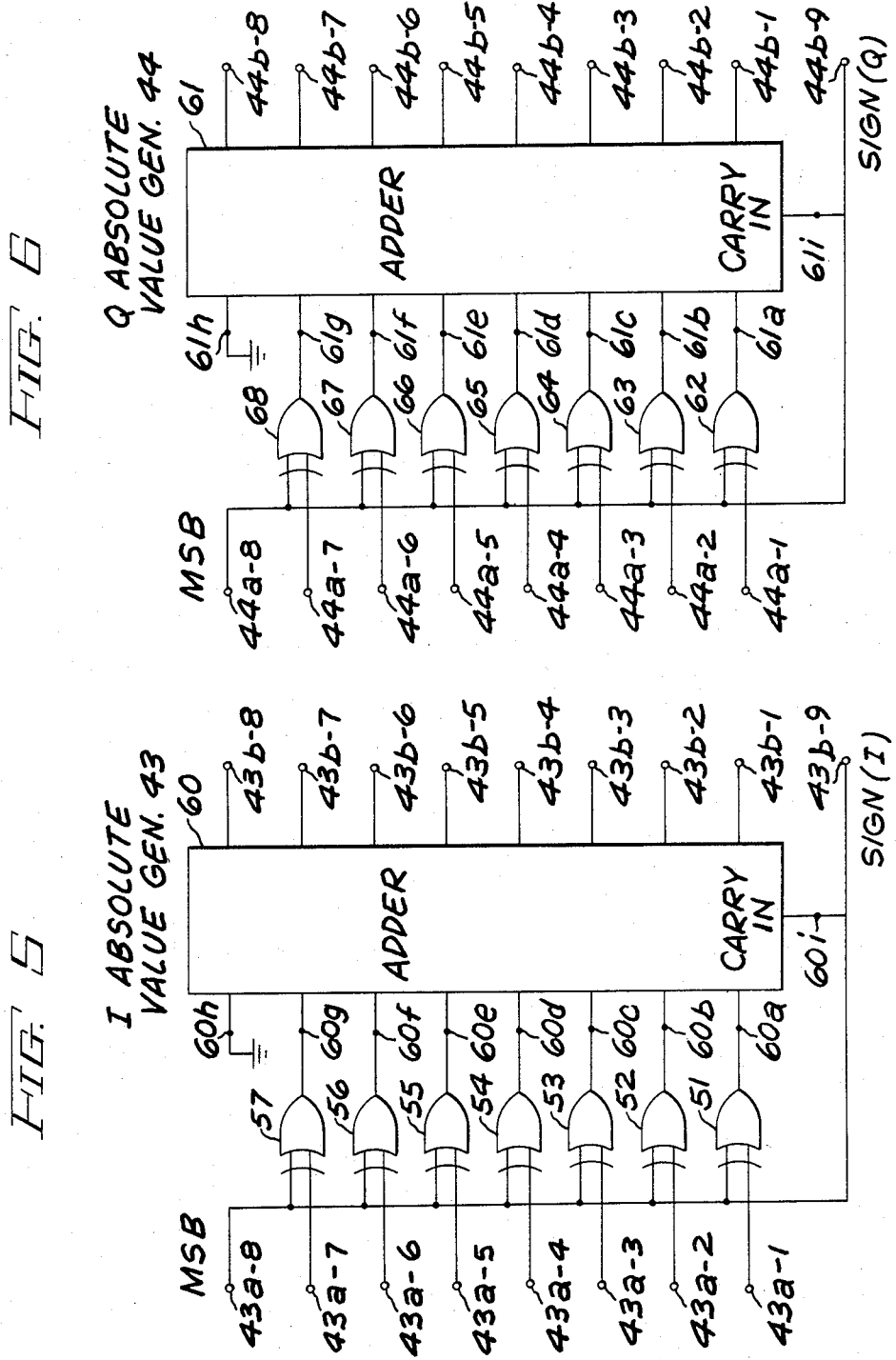

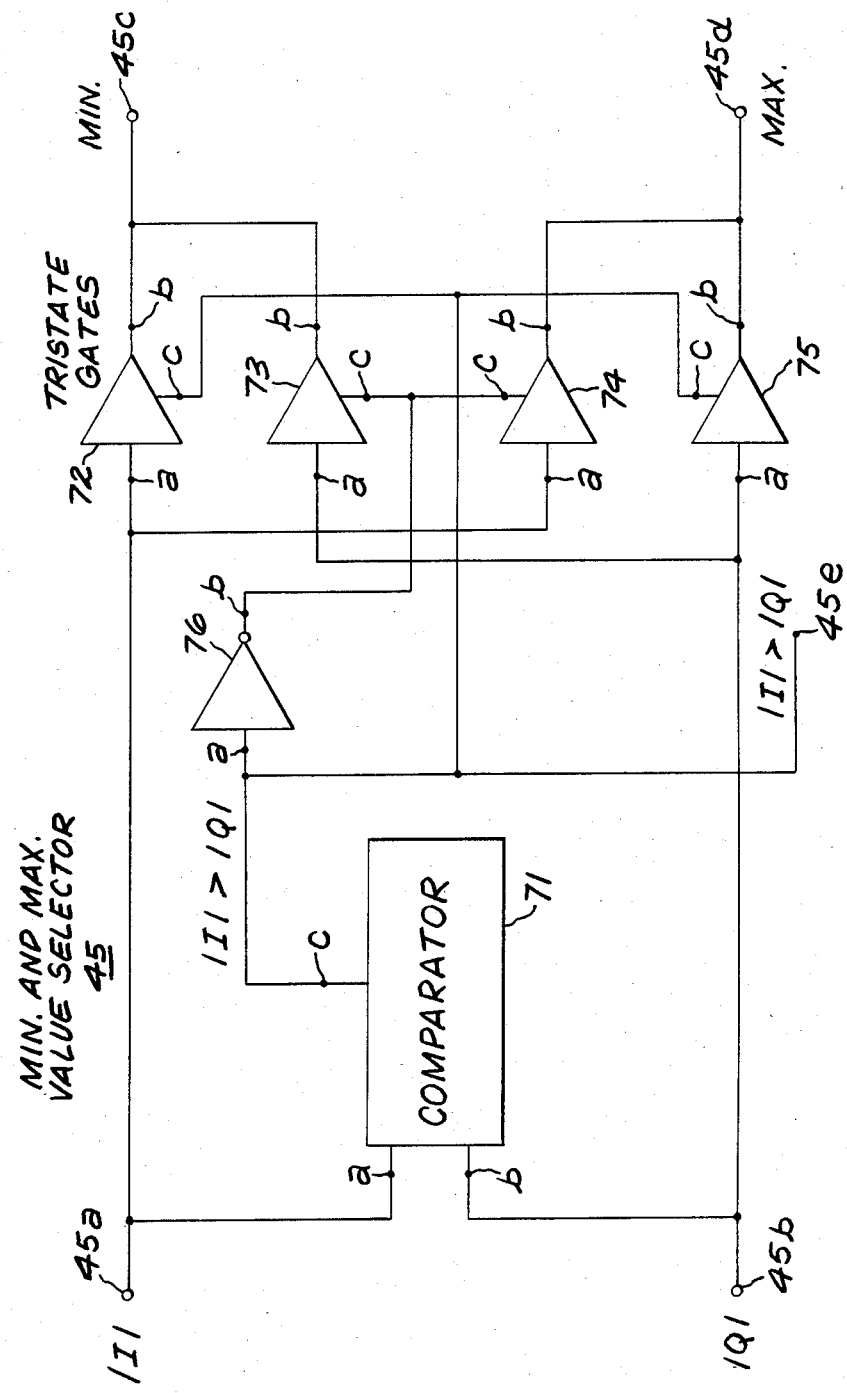

FREQUENCY MODULATION DETECTOR USING DIGITAL SIGNAL VECTOR PROCESSING

The present invention relates in general to frequency modulation detectors and in particular to frequency modulation detectors which avoid the use of intermediate frequency (IF) stages.

Conventionally, detection of a frequency modulated (FM) signal is accomplished by reducing the carrier frequency of the FM signal to an intermediate frequency by mixing the signal with a local signal of appropriate frequency. Thereafter, the intermediate frequency signal is amplified in stages of an intermediate frequency channel. The output of the intermediate frequency channel is supplied to a circuit which provides an output which is a function of frequency to recover the signal modulating the FM carrier. A large fraction of the physical volume of an FM radio is used for IF components. Also, the IF components contribute significantly to the cost of the receiver as well.

The present invention is directed to the detection of FM signals which avoids the use of an intermediate frequency channel.

Another object of the present invention is to provide an FM detector which can be integrated on a single semiconductor chip.

Another object of the present invention is to provide rejection of amplitude modulation detection in an FM detector.

A further object of the present invention is to provide an FM detector in which as much of the signal processing as possible is performed digitally to render signal processing relatively independent of the variations in components and processes inherent in analog circuitry.

In carrying out the invention in accordance with an illustrative embodiment thereof, in a detector for recovering a modulating signal from a carrier modulated in frequency by the modulating signal, there is provided means for generating first and second signals in phase quadrature at a reference frequency substantially equal to the center frequency of the carrier. Means are also provided responsive to the phase-quadrature reference signals for converting a frequency modulated carrier into respective first and second baseband signals. Means are provided for filtering the double reference frequency components of the first and second baseband signals to provide respective I and Q signals. The I and Q signals constitute in rectangular coordinates a vector represented in polar coordinates by R and $\theta$, where R is the maximum amplitude of the I and Q signals and $\theta$ is the instantaneous angle represented by the arctangent of the I signal divided by the Q signal. Means are provided for sampling the I and Q signals at a frequency greater than twice the maximum deviation in frequency of said carrier produced by said modulating signal to obtain a sequence of sets of samples of the I and Q signals, each set of samples being represented by a respective vector R and a respective angle $\theta$ consisting of a first angle component equal to zero or an integral number of octants and a second angle component less than an octant which is either added to or subtracted from the first angle component depending on whether the vector R is in an odd or an even octant.

Means are provided for converting each of the I signal samples into a respective binary number. Means are provided for converting each of the Q signal samples into a respective binary number. Means are provided for deriving the absolute binary value of each of the binary numbers corresponding to a respective I signal sample. Means are provided for deriving the absolute binary value of each of the binary numbers corresponding to a respective Q signal sample.

Comparator means are provided responsive to the absolute binary value of an I signal sample and to the absolute binary value of a Q signal sample of a set of I and Q signal samples for developing a binary 1 when the absolute value of an I signal sample is greater than the absolute value of a Q signal sample and a binary 0 when the absolute value of an I signal sample is not greater than the absolute value of a Q signal sample. Means are provided for deriving from the binary number of an I signal sample, from the binary number of a Q signal sample, and from the bit at the output of said comparator for each set of signal I and Q samples a respective first binary number from 000 to 111 representing the first angle component of a respective angle $\theta$.

A binary divider is provided having a numerator input, a denominator input, and a quotient output. In response to the absolute value of a binary number applied to the numerator input and the absolute value of a binary number applied to the denominator input, the binary divider provides a binary number at the quotient output representing the value of the binary number applied to the numerator input divided by the value of the number applied to the denominator input.

Means are provided responsive to a binary 1 from the comparator for passing the absolute binary number of an I signal sample to the denominator input of the divider and for passing said absoute binary number of a Q signal sample to the numerator input of the divider whereby at the quotient output is obtained a binary number corresponding to the quotient of the absolute binary numbers of a set of I and Q signal samples, and responsive to a binary 0 from the comparator for passing the absolute binary number of a I signal sample to the numerator input of the divider and for passing the absolute binary value of a Q signal sample to the denominator input of the divider whereby at the quotient output is obtained a binary number corresponding to the quotient of the binary numbers.

Means are provided responsive to each binary number obtained at the quotient output of the divider to provide a respective second binary number representing the second angle component of a respective angle $\theta$. Means are provided for combining the first binary number and the second binary number of each of the sets of samples to obtain a respective third binary number representing the respective angle $\theta$ thereof. Means are provided for obtaining a sequence of changes in the value of the third binary numbers of successive sets of the sequence of sets of I and Q signal samples, the sequence of changes representing changes in frequency of the carrier from the center frequency thereof corresponding to changes in amplitude of the modulating signal. Means are provided for converting each number of the sequence of changes in the value of successive third binary numbers into a respective amplitude level whereby the modulating signal is recovered.

The novel features which are believed to be characteristic of the present invention are set forth with particularity in the appended claims. The invention itself, however, both as to its organization and method of operation, together with further objects and advantages thereof, may best be understood by reference to the following description taken in connection with the accompanying drawings wherein:

FIG. 5 shows a schematic diagram of the I sample absolute value generator 43 of FIG. 4.

FIG. 6 shows a schematic diagram of the Q sample absolute value generator 44 of FIG. 4.

FIG. 7 shows a schematic diagram of the minimum and maximum value selector 45 of FIG. 4.

Figure 1:
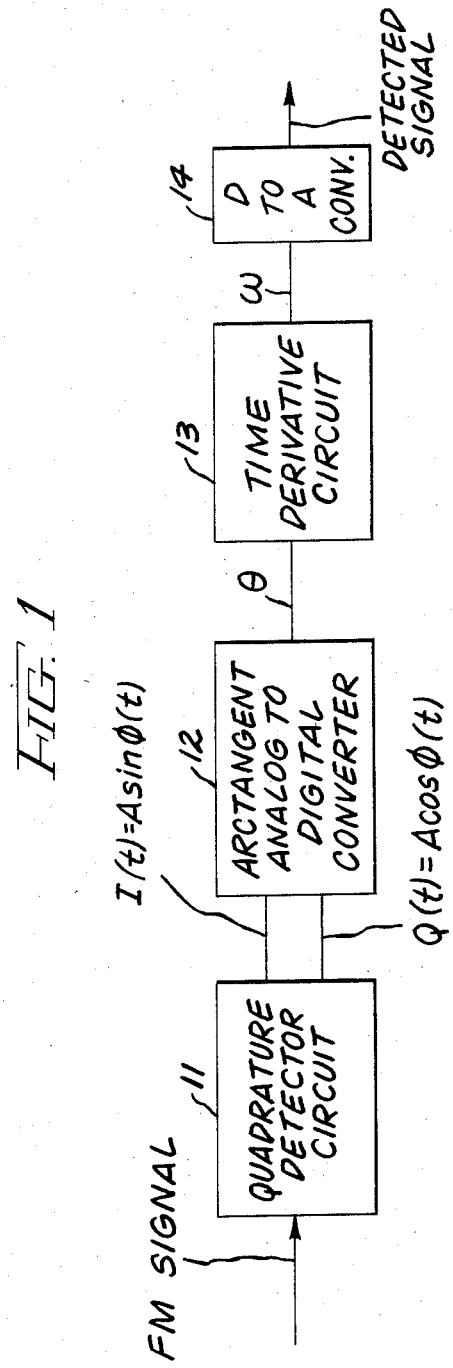
FIG. 1 shows a block diagram of a frequency modulation detector in accordance with the present invention.

A frequency modulated signal S(t) may be represented by the equation:

$$S(t) = A \cos(\omega_c t + \phi(t)),  \quad (1)$$

where $\omega_c$ is the carrier frequency, $\phi(t)$ is the phase deviation of the carrier produced by frequency modulation of the carrier and t represents time.

To demodulate the frequency modulated signal, it is necessary to detect the modulation in frequency of the carrier. Conventionally, the detection is accomplished by reducing the carrier frequency of the signal to an intermediate frequency by mixing it with local reference signal of appropriate frequency. Thereafter the intermediate frequency signal is amplified in stages of an intermedie frequency channel. The amplified intermediate frequency signal is then applied to a circuit which provides an output which is a function of frequency to recover the modulating signal.

The modulating signal may also be recovered without the use of an intermediate frequency channel. In this case the frequency modulated signal is reduced to a pair of baseband signals in phase quadrature utilizing a pair of local reference signals of a frequency substantially equal to the center frequency of the carrier and in phase quadrature. The local reference signals $\cos \omega_c t$ and $\sin \omega_c t$ are mixed or multiplied with the frequency modulated carrier signal S(t) to produce the signals $$[A \cos(\omega_c t + \phi(t))] \times [\cos \omega_c t] = \tfrac{1}{2}[A \cos \phi(t) + A \cos(2\omega_c t + \phi(t))]. \quad (2)$$

$$[A \cos(\omega_c t + \phi(t))] \times [\sin \omega_c t] = \tfrac{1}{2}[A \sin \phi(t) + A \sin(2\omega_c t + \phi(t))]. \quad (3)$$

The signals of substantially twice reference frequency are filtered to recover the baseband signals:

$$I(t) = A \sin \phi(t) \quad (4)$$

$$Q(t) = A \cos \phi(t) \quad (5)$$

The function $\phi(t)$ includes the modulation of the carrier frequency $\omega_c$.

If the carrier is modulated by a signal having a frequency $\omega_1$ and an amplitude producing a maximum deviation of the carrier frequency of $\Delta\omega_c$, then:

$$\phi(t) = \Delta\omega_c \cos \omega_1 t \text{ and} \quad (6)$$

$$I(t) = A \sin(\Delta\omega_c \cos \omega_1 t) \quad (7)$$

$$Q(t) = A \cos(\Delta\omega_c \cos \omega_1 t) \quad (8)$$

The I(t) and Q(t) functions can be generated by a vector R of length A rotating at a frequency of $\Delta\omega_c \cos \omega_1 t$, where Q(t) is selected as the horizontal coordinate and I(t) is selected as the vertical coordinate of a rectangular coordinate system. To detect one amplitude level of the modulating signal it is simply necessary to divide the difference $(\theta_2 - \theta_1)$ in the angular positions $\theta_1$ and $\theta_2$ of the vector R at two different times $t_1$ and $t_2$ by the period of time $(t_2 - t_1)$ taken by the vector to move from angular position $\theta_1$ to angular position $\theta_2$. This amplitude level of the modulating signal can be accurately determined by making the time interval $(t_2 - t_1)$ smaller than one half the period of a cycle of the maximum deviation frequency. Successive levels of the modulating signal are similarly obtained at successive intervals of time.

The mode of detection of a FM signal described above is utilized in accordance with the present invention. The baseband signals I(t) and Q(t) are derived from the frequency modulated signal. The I(t) and Q(t) signals are sampled at a rate which is large in relation to the maximum frequency deviation produced by the modulating signal as pointed out above. For each set of I(t) and Q(t) samples, a ratio of $I_{sample}/Q_{sample}$ is obtained representing the tangent of the angle $\theta$ of the vector R corresponding to the samples. For the tangent of each set of samples, the angle of the corresponding vector R is obtained. The difference in angular displacement of a pair of successive vectors divided by the period of sampling represents the angular velocity or frequency of the vector and also the amplitude level of the modulating signal during that period. Over successive sampling periods, successive levels of the modulating signal are obtained thereby recovering the modulating signal including the frequency components thereof.

In accordance with another aspect of the present invention, each set of samples of the I(t) and Q(t) signals are processed digitally to provide binary numbers corresponding to the angle $\theta$ of a respective vector R thereof. By obtaining the difference in successive binary numbers, a sequence of binary numbers representing successive levels of the modulating signal is obtained. Conversion of the sequence of binary numbers into a sequence of analog levels recovers the modulating signal.

Reference is now made to FIG. 1 which shows a block diagram of frequency modulation detection apparatus 10 in accordance with the present invention. The apparatus 10 includes a quadrature detector circuit 11 for converting a frequency modulated signal S(t) as set forth in equation (1) to a pair of baseband signals I(t) and Q(t) as set forth in equations (4) and (5), respectively. The apparatus also includes an arctangent analog-to-digital converter 12 which samples the I(t) and Q(t) signals at a rate which is large in relation to the maximum frequency deviation produced by the modulating signal to produce a sequence of samples for each of the signals. For each set of I(t) and Q(t) samples a respective ratio of the I sample to the Q sample is obtained. Each ratio represents the tangent of the angle coordinate of a respective rotating vector R as described above. For the tangent of each of samples the angle of the corresponding vector R is obtained and provided as a binary number. The apparatus also includes a time derivative circuit 13 in which the rate of change of the binary number representing the angular displacement of the vector R is obtained and provided as a binary number. Successive values of the binary number represent successive deviations in frequency of the carrier and correspond to successive levels of the modulating signal. The apparatus 10 also includes a digital-to-analog converter 14 which converts successive binary numbers obtained from the time derivative circuit into corresponding analog levels representing the modulating signal.

Figure 2:
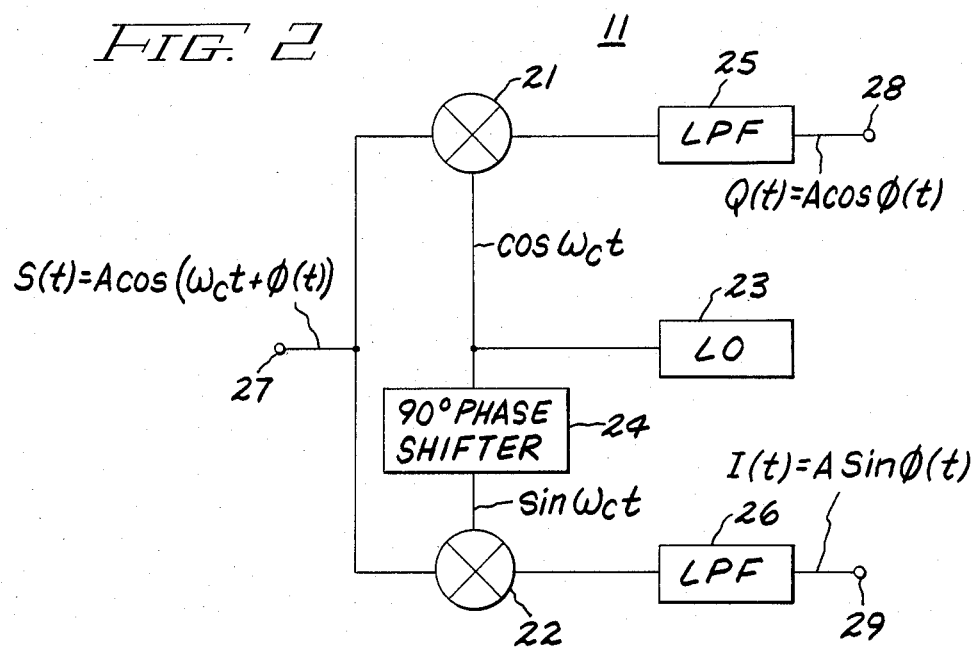
FIG. 2 shows a block diagram of the quadrature detector circuit of FIG. 1.

Reference is now made to FIG. 2 which shows a block diagram of the quadrature detector circuit 11 of FIG. 1. The quadrature detector circuit 11 includes a first mixer 21, a second mixer 22, a local oscillator which provides at its output a signal $\cos \omega_c t$, a 90° phase shifter 24 and a first low pass filter 25 and a second low pass filter 26. Quadrature detector circuit 11 also includes an input terminal 27 and output terminals 28 and 29. Input terminal 27 is connected to a first input terminal of first mixer 21 and a first input terminal of the second mixer 22. The output of the local oscillator 23 is connected to a second input terminal of first mixer 21 and is also connected to a second input terminal of the second mixer through a 90° phase shifter 24 which shifts the phase of the signal from the local oscillator 23 by 90°. The output of the first mixer 21 is connected through low pass filter 25 to output terminal 28. The output of the second mixer 22 is connected to low pass filter 26 to the output terminal 29. A frequency modulated signal S(t) as set forth in equation (1) is applied at input terminal 27. The frequency modulation signal is multiplied or mixed in the first mixer 21 with the signal $\cos \omega_c t$ from the local oscillator 23 to produce at the output terminal thereof the signal set forth in equation (2). The frequency modulated signal is also mixed with the phase shifted signal $\sin \omega_c t$ in the second mixer 22 to provide at its output terminal the signal set forth in equation (3). The low pass filter 25 filters the double reference frequency component of the signal of equation (2) and provides at output terminal 28 the signal of equation (5). Similarly, the low pass filter 26 filters the double reference frequency component of the signal of equation (3) and provides at output terminal 29 the signal I(t) set forth in equation (4).

Figure 3:
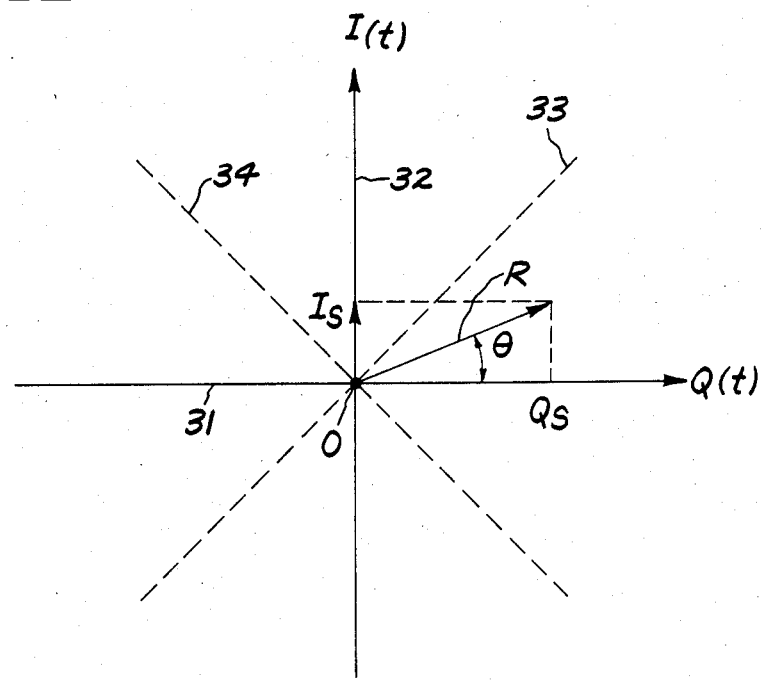
FIG. 3 shows a rectangular coordinate system superimposed on a polar coordinate system useful in explaining the operation of the invention.

Reference is now made to FIG. 3 which shows a rectangular coordinate system with a horizontal coordinate axis 31 and a vertical coordinate axis 32 passing through an origin. The equations (4) and (5) define a vector R of amplitude A rotating in a counterclockwise direction about the origin. At time t the vector R makes an angle $\theta$ with the horizontal axis 31. The function $I(t) = A \sin \phi(t)$ is represented by the projection of the vector R onto the vertical axis and function $Q(t) = A \cos \phi(t)$ is represented by the projection of the vector R onto the horizontal axis. Dotted line 33 making an angle of 45° with the horizontal axis 31 divides each of the first and third quadrants into a pair of octants. Similarly, the dotted line 34 making an angle of 135° with respect to the horizontal axis 31 divides each of the second and fourth quadrants into a pair of octants.

Figure 4:
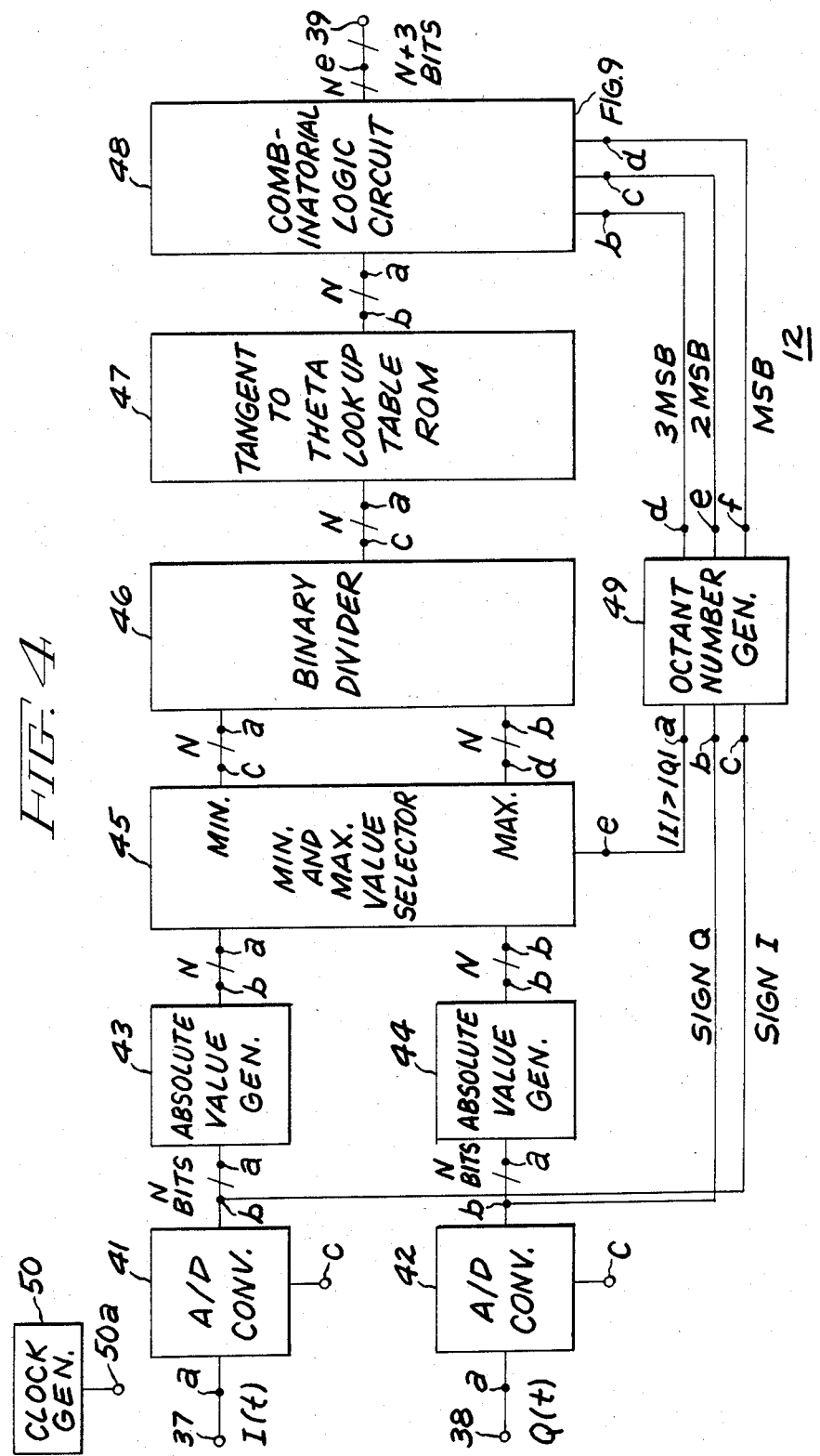
FIG. 4 shows a block diagram of the arctangent analog-to-digital converter of FIG. 1.

Reference is now made to FIG. 4 which shows a block diagram of the arctangent analog-to-digital converter 12 of FIG. 1. The arctangent analog-to-digital converter 12 includes an input terminal 37 to which is applied the signal I(t), an input terminal 38 to which is applied the signal Q(t), and an output terminal 39 in the form of a plurality of lines on which bits are obtained representing a binary number corresponding to the angle $\theta$. The converter 12 also includes analog-to-digital converter 41 for sampling the signal I(t) applied to terminal 37 and provides a binary output in 2's complement representation for each sample. The analog-to-digital converter 41 includes input terminal 41a and output terminal 41b collectively representing terminals at which N bits of the binary value of the I sample are obtained. The converter 41 also includes clocking terminal 41c. Input terminal 41a is connected to terminal 37. The converter also includes analog to digital converter 42 for sampling the signal Q(t) applied to terminal 38 and provides a binary output in 2's complement representation for each sample. The analog-to-digital converter 42 includes input terminal 42a and output terminal 42b collectively representing terminals at which N bits of the Q sample are obtained. The converter 42 also includes clocking terminal 42c. Input terminal 42a is connected to terminal 38.

The converter 12 also includes absolute value generator 43 having an input terminal 43a connected to terminal 41b and an output terminal 43b, which converts each binary sample at its input terminal 43a into an absolute binary value at its output terminal 43b. The input terminal 43a collectively represents terminals at which N bits of the I sample are obtained. Output terminal 43b represents terminals at which N bits of the absolute value of the I sample are obtained. The converter 12 also includes absolute value generator 44 having an input terminal 44a connected to terminal 42b and an output terminal 44b, which converts each binary sample at its input terminal 44a into absolute binary value at its output terminal 44b. The input terminal 44a collectively represents terminals at which N bits of the Q sample are obtained. Output terminal 44b represents terminals at which N bits of the absolute value of the Q sample are obtained.

The converter 12 also includes a minimum and maximum value selector 45 having N bit input terminals 45a and 45b, N bit output terminals 45c, 45d and a single bit output terminal 45e. The selector 45 selects the smaller of the two binary values of a set of I and Q samples applied to terminals 45a and 45b and provides this value at terminal 45c and also selects the larger of the two binary values of a set of I and Q samples applied to terminals 45a and 45b and provides this value at terminal 45d. Terminal 45a is connected to terminal 43b and terminal 45b is connected to terminal 44b.

The converter 12 also includes a binary divider 46 having a N bit numerator terminal 46a, an N bit denominator terminal 46b, and an N bit quotient terminal 46c. In response to an N bit number applied to the numerator terminal 46a and an N bit number applied to the denominator terminal 46b an N bit number is obtained at the quotient terminal 46c equal to $2^N$ times the number applied to the numerator terminal, divided by the number applied to the denominator terminal. Binary divider circuits capable of performing this function such as logic circuits which implement long division arithmetic, are well known in the art.

The converter 12 also includes a tangent to theta lookup table read-only memory (ROM) 47 for providing for each tangent number obtained from the binary divider 46 a respective binary number of N bits representing the arctangent thereof. The tangent to theta lookup table ROM 47 includes an input terminal 47a collectively representing N terminals and an output terminal 47b collectively representing N terminals. The input terminal 47a is connected to output terminal 46c.

The converter 12 also includes octant number generator 49 having input terminals 49a, 49b, and 49c and output terminals. The generator 49 in response to a comparator bit from selector 45, a sign bit from analog-to-digital converter 42 and a sign bit from analog-to-digital converter 41 applied to respective input terminals 49a, 49b and 49c provides at output terminals 49d, 49e and 49f a three-bit word representing the octant location of a set of I and Q samples.

The converter 12 also includes a combinatorial logic circuit 48 for combining each number obtained from the tangent to theta lookup table ROM 47 with a respective number from octant number generator 49 representing the angle $\theta$ corresponding to a respective set of signal samples. The combinatorial logic circuit 48 includes an input terminal 48a collectively representing N terminals, an input terminal 48b connected to terminal 49d, an input terminal 48c connected to terminal 49e, an input terminal 48d connected to terminal 49f and an output terminal 48c collectively representing N+3 terminals. Output terminal 48e is connected to terminal 39.

Figure 10:
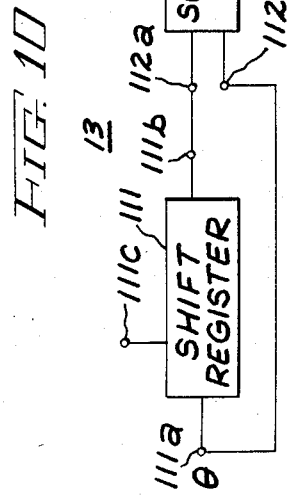
FIG. 10 shows a block diagram of the time derivative circuit of FIG. 1.

The converter also includes clock pulse generator 50 having an output terminal 50a. Output terminal 50a is connected to clocking terminal 41c of analog-to-digital converter 41, clocking terminal 42c of analog-to-digital converter 42, and clocking terminal 111c of shift register 111 (FIG. 10).

Reference is now made to FIG. 5 which shows a schematic diagram of absolute value generator 43 of FIG. 4. The generator 43 includes eight input terminals 43a-1 through 43a-8, eight output terminals, 43b-1 through 43b-8 and a sign (I) terminal 43b-9. The circuit also includes seven exclusive-OR gates 51-57 each having a pair of input lines and an output line. The circuit also includes an adder 60 including eight input terminals 60a-60h, a carry-in terminal 60i and eight output terminals 43b-1 through 43b-8. Terminals 43a-1 through 43a-7 are connected to one input line of respective exclusive-OR gates 51-57. Terminal 43a-8 is connected to the other input lines of exclusive-OR gates 51-57, to carry-in terminal 60i and to sign (I) output terminal 43b-9. The output lines of exclusive-OR gates 51-57 are connected to input terminals 60a-60g of adder 60. Input terminal 60h is connected to ground. Consider now the operation of the absolute value generator using two's complement representation. For a negative number, the most significant bit is a 1. Accordingly the complement of the number appears at the output of the exclusive-OR gates 51-57 and is applied to the input of the adder 60 along with the most significant bit being applied to carry-in terminal 60i. Thus, at the output terminals 43b-1 through 43b-8 is obtained the complement of the number to which a 1 has been added which is the absolute value of the negative number. For a positive number, the most significant bit is a 0. Thus, the carry-in bit is a 0 and the positive number is simply passed to the output terminals 43b-1 through 43b-8 of the adder. Note that input terminal 60h is connected to ground eliminating the need for an additional exclusive-OR gate as in either of the operations described its output would be a 0.

Reference is now made to FIG. 6 which shows a schematic diagram of absolute value generator 44 of FIG. 4. The generator 44 includes input terminals 44a-1 through 44a-8, output terminals 44b-1 through 44b-8, and a sign (Q) terminal 44b-9. The circuit also includes seven exclusive-OR gates 62-68 each having a pair of input lines and an output line. The circuit also includes an adder 61 including eight input terminals 61a-61h, a carry-in terminal 61i and eight output terminals 44b-1 through 44b-8. Terminals 44a-1 through 44a-7 are connected to one input line of respective exclusive-OR gates 62-68. Terminal 44a-8 is connected to the other input lines of exclusive-OR gates 62-68, to carry-in terminal 61i and to sign (Q) output terminal 44b-9. The output lines of exclusive-OR gates 62-68 are connected to input terminals 61a-61g of adder 61. Input terminal 61h is connected to ground. The operation of the absolute value generator 44 is identical to the operation of the absolute value generator 43 described above.

Reference is now made to FIG. 7 which shows a schematic diagram of maximum and minimum value selector 45 of FIG. 4. The selector 45 selects the smaller of the two absolute binary values of a set of I and Q samples applied to terminals 45a and 45b and provides this value at terminal 45c and also selects the larger of the two absolute binary values of a set of I and Q samples applied to terminals 45a and 45b and provides this value at terminal 45d. The selector 45 includes N-bit input terminals 45a and 45b, N-bit output terminals 45c and 45d and single-bit output terminal 45e. The selector 45 also includes comparator 71 having N-bit input terminals 71a and 71b and a single-bit output terminal 71c. The comparator, in response to the absolute value of an I sample applied at terminal 71a and to the absolute value of a Q sample applied at terminal 71b, provides a 1 bit at output terminal 71c if the absolute value of the I sample is greater than the absolute value of the Q sample and provides a 0 bit at output terminal 71c if the absolute value of the I sample is not greater than the absolute value of the Q sample. Comparator 71 may be comparator type 7485 made by Texas Instruments Incorporated of Dallas, Texas. The selector also includes tristate gates 72-75, each having an N-bit input terminal a, an N-bit output terminal b, and a control terminal c. Each of the tristate gate 72-75 passes data from its input terminal to its output terminal when a 0 bit or low level signal is applied to its control terminal and does not pass data from its input to its output terminal when a 1 bit or high level signal is applied to its control terminal. The tristate gates 72-75 may be tristate gate type 74LS373 made by Texas Instruments of Dallas, Texas. The selector also includes an inverter 76 having an input terminal 76a and an output terminal 76b. Terminal 45a is connected to terminals 71a, 72a and 74a. Terminal 45b is connected to terminals 71b, 73a, and 75a. Terminal 71c is connected to terminals 76a, 72c, 75c and 45e. Terminal 76b is connected to terminals 73c and 74c. Terminal 45c is connected to terminals 72b and 73b. Terminal 45d is connected to terminals 74b and 75b. Assume that the absolute value of the I sample is greater than the absolute value of the Q sample. The comparator 71 provides a 1 bit at output terminal 71c which is applied to control terminals 72c and 75c of tristate gates 72 and 75 blocking passage of the I sample to the minimum output terminal 45c and blocking passage of the Q sample to the maximum output terminal 45d. The 1 bit from the comparator is inverted by inverter 76 and applied to control terminal 73c and 74c of tristate gates 73 and 74 allowing passage of the Q sample to minimum output terminal 45c and allowing passage of the I sample to the maximum output terminal 45d. The 1 bit from the output of the comparator 71 is also passed to output terminal 45e. If the absolute value of the I sample is not greater than the absolute value of the Q sample, the tristate gates 72 and 75 are activated to pass the I sample to minimum output terminal 45c and to pass the Q sample to maximum output terminal 45d. The tristate gates 73 and 74 having a low level signal applied to the control terminals thereof block the passage of signals therethrough.

Figure 8:
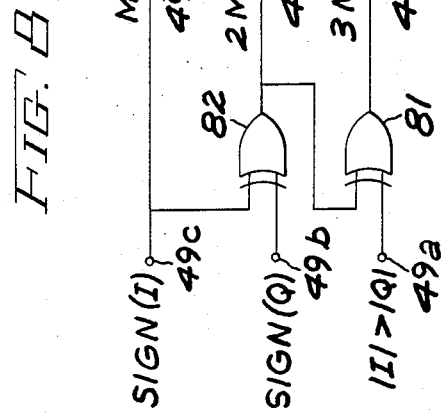
FIG. 8 shows a schematic diagram of the octant number generator 49 of FIG. 4.

Reference is now made to FIG. 8 which shows a schematic diagram of the octant number generator 49 of FIG. 4. The generator 49 includes exclusive-OR gates 81 and 82. One input terminal of gate 81 is connected to input terminal 49a and the other input terminal of gate 81 is connected to the output terminal of gate 82. One input terminal of gate 82 is connected to input terminal 49b and the other input terminal of gate 82 is connected to terminal 49c. The output terminals of gates 81 and 82 are connected to respective output terminals 49d and 49e. Input terminal 49c is also connected to output terminal 49f. The operation of the circuit of FIG. 8 will be apparent from Table 1. Table 1 has rows designated Octant No., Sign (I), Sign (Q), 2MSB, $|I|>|Q|$, and 3 MSB. The octant numbers are set out in eight columns designated 0–7. The sign bit of the I sample in the first four octants is 0 as the I sample has a positive value in the octants, as apparent from FIG. 3. The sign bit of the I sample in the next four octants is 1 as the I sample has a negative value in these octants. Similarly the sign bits of the Q samples are as shown 0 for the first two octants, 1 for the next four octants, and 0 for the last two octants. For the row in which the absolute value of the I sample is compared with the absolute value of the Q sample, the value bit is 0 for the first octant as the Q sample is larger than the I sample, the bit is 1 for the second octant as I sample is greater than the Q sample, etc. By exclusive-ORing the Sign (I) bit with the Sign (Q) bit for each octant, the second MSB is obtained for each octant, as shown. By exclusive-ORing the second MSB with the $|I|>|Q|$ bit for each octant, the third MSB for each octant is obtained.

TABLE 1

|  | Octant No. | | | | | | | |
| --- | --- | --- | --- | --- | --- | --- | --- | --- |
|  | 0 | 1 | 2 | 3 | 4 | 5 | 6 | 7 |
| Sign (I) | 0 | 0 | 0 | 0 | 1 | 1 | 1 | 1 |
| Sign (Q) | 0 | 0 | 1 | 1 | 1 | 1 | 0 | 0 |
| 2MSB | 0 | 0 | 1 | 1 | 0 | 0 | 1 | 1 |
| $|I|>|Q|$ | 0 | 1 | 1 | 0 | 0 | 1 | 1 | 0 |
| 3MSB | 0 | 1 | 0 | 1 | 0 | 1 | 0 | 1 |

Figure 9:
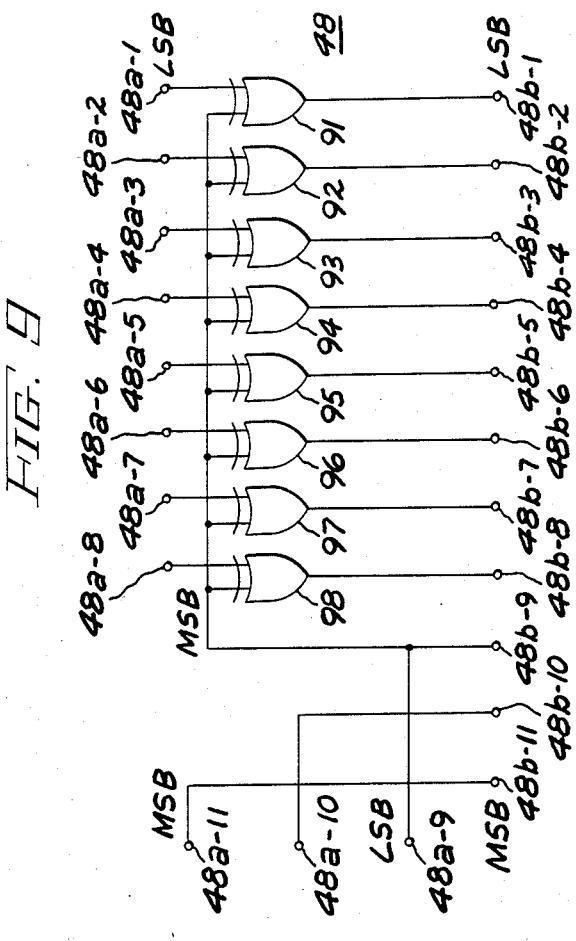
FIG. 9 shows a schematic diagram of the combinatorial logic circuit 48 of FIG. 4.

Reference is now made to FIG. 9 which shows a schematic diagram of the combinatorial logic circuit 48 of FIG. 4. The circuit 48 includes eleven input terminals designated 48a-1 through 48a-11 and eleven output terminals 48b-1 through 48b-11. The circuit also includes eight exclusive-OR gates 91–98 each having a pair of input lines and an output line. One of the input lines of each of the gates is connected to a respective one of input terminals 48a-1 through 48a-8. The other input line of each of the gates is connected to input terminal 48a-9. Each of the output lines of the gates is connected to a respective one of output terminals 48b-1 through 48b-8. Input terminals 48a-9 through 48a-11 are connected to respective output terminals 48b-9 through 48b-11. Input terminals 48a-1 through 48a-8 are connected to the output of ROM 47. Input terminals 48a-9 through 48a-11 are connected to respective terminals 48b, 48c and 48d which in turn are connected to respective output terminal 49d, 49e and 49f of octant number generator 49. The least significant bits of the input to combinatorial logic circuit 48 appear at terminals 48a-1 through 48a-8. The most significant bits of the input appear at the terminals 48a-9 through 48a-11. At the output terminals 48b-1 through 48b-11 is obtained a binary number representing the angle $\theta$.

TABLE 2

| Number from Octant Number Generator 49 | Number from ROM 47 | Number from Circuit 48 |
| --- | --- | --- |
| 0 0 0 | k | 0 + k |
| 0 0 1 | k | 512 − k |
| 0 1 0 | k | 512 + k |
| 0 1 1 | k | 1024 − k |
| 1 0 0 | k | 1024 + k |
| 1 0 1 | k | 1536 − k |
| 1 1 0 | k | 1536 + k |
| 1 1 1 | k | 2048 − k |

The operation of the circuit of FIG. 9 will be apparent from Table 2 to which reference is now made. Table 2 shows in a first column the binary numbers 000 to 111 provided by octant number generator 49, each for a respective one of eight octants and also shows in a second column a number k obtained from ROM 47. It is assumed that number N representing the bits in the output ROM 47 is 8. Accordingly, the number k has a range of 0–255 and each octant is represented by the number 256. The third column of Table 2 shows whether the number k is to be added to or subtracted from quadrant numbers. The subtraction operation is performed when the least significant bit of the number in column 1 is a 1. As this least significant bit is applied to one of the inputs of the exclusive-OR gates 91–98, at the output of the exclusive-OR gates is obtained the complement of the number k which is added to a number 256 units less than the number from which k is to be subtracted.

Reference is now made to FIG. 10 which shows a block diagram of the time derivative circuit 13 of FIG. 1. The time derivative circuit 13 includes a shift register 111 having an input terminal 111a collectively representing eleven terminals, an output terminal 111b collectively representing eleven terminals and a clocking terminal 111c. The shift register 111 includes eleven channels each having a single stage. The time derivative circuit 13 also includes a subtraction circuit 112 having a first input terminal 112a collectively representing eleven terminals, a second input terminal 112b collectively representing eleven terminals and an output terminal 112c collectively representing eleven terminals. The input terminal 111a of shift register 111 is connected to the output terminal 39 of the arctangent to digital converter 12 of FIG. 4. The input terminal 111a is also connected to input terminal 112b of subtraction circuit 112. The output terminal 111b is connected to input terminal 112a of subtraction circuit 112. Clock terminal 111c is connected to terminal 50a of clock generator 50.

In operation, a sequence of numbers representing a sequence of values of the angle $\theta$ appearing at input terminal 111a is delayed in shift register 111 by one clock cycle and appears at output terminal 111b. The subtraction circuit 112 subtracts each number appearing at the input terminal 112b from a respective number appearing concurrently at the input terminal 112a. A sequence of the difference in two concurrent numbers is obtained at the output of terminal 112c of the subtraction circuit. Each difference represents the change $\Delta\theta$ in value of the angle $\theta$ over the period $\Delta t$ of a clock cycle of the shift register 111. Each difference corresponds to a respective deviation frequency representing a respective amplitude level of the modulating signal.

Summarizing the operation of the FM detector of FIGS. 1–10, an FM signal from a source such as an RF amplifier is applied to the quadrature detector circuit 11 of FIGS. 1 and 2 and at the output thereof signals I(t) and Q(t) are obtained. The center frequency of the FM carrier, for example, would be about 100 MHz. The maximum deviation of the carrier in response to frequency modulation thereof would be about 75 KHz, and the signal modulating the carrier would have frequencies up to about 53 KHz. The maximum frequency of the I(t) and Q(t) signals would be 75 KHz.

The I(t) and Q(t) signals are applied to arctangent analog-to-digital converter 12 of FIGS. 1 and 4. The signal I(t) is sampled by the analog-to-digital converter 41 which provides at its output terminal a sequence of samples, each sample of N bits in two's complement representation. The signal Q(t) is sampled by the analog-to-digital converter 42 which provides at its output a sequence of binary samples, each of N bits in two's complement representation. The sampling rate is under the control of clock generator 50. The sampling rate is set to be greater than twice the maximum deviation frequecy of 75 KHz, for example 228 KHz. The clocking signal is applied to clocking terminals of analog-to-digital converters 41 and 42. The sequence of I samples is converted into a sequence of absolute values, each sample of N bits, by the absolute value generator 43. The sequence of Q samples is converted into a sequence of absolute values, each sample of N bits, by the absolute value generator 44. Each set of absolute values of an I signal sample and a Q signal sample is processed to provide the smaller value at the minimum output terminal 45c of the selector 45 and to provide the larger value at the maximum output terminal 45d of the selector 45. The binary divider 46 converts the smaller value applied to the numerator terminal thereof and the larger value applied to the denominator terminal thereof into a quotient of N bits representing the minimum value divided by the maximum value of a set of samples. This value represents the tangent of an angle equal to or less than 45°. The number obtained at the output of the binary divider 46 accesses a number in the tangent theta look-up table ROM 47 which represents the arctangent thereof. The octant number obtained at the output of the octant number generator 49 corresponding to the set of signal samples is combined in the combinatorial logic circuit 48 with the arctangent number obtained from ROM 47 to provide a number from 0 to 2047 representing the angle $\theta$ (0° to 359.824°) of the vector R of the set of signal samples being processed. Thus, at the output of the arctangent analog-to-digital converter 12 is obtained a sequence of numbers, each of the numbers representing the angle $\theta$ for a respective set of signal samples. These numbers are applied to the time derivative circuit 13 of FIGS. 1 and 10 to obtain a sequence of numbers each representing the rate of change of the angle $\theta$ of the signals I and Q. The rate of change of the angle $\theta$ corresponds to the frequency deviation of the carrier. The binary numbers representing the frequency deviation are converted into analog signal samples by the digital-to-analog converter 14 of FIG. 1. The output of the digital-to-analog converter 14 is the modulating signal.

While the invention has been described in a specific embodiment, it will be understood that modifications may be made by those skilled in the art and it is intended by the appended claims to cover all such modifications and changes as fall within the true spirit and scope of the invention.

What is claimed is:

1. A detector for recovering a modulating signal from a carrier modulated in frequency by the modulating signal comprising means for generating first and second signals in phase quadrature and at a reference frequency substantially equal to the center frequency of said carrier, means responsive to said phase-quadrature reference signals for converting the frequency modulated carrier into first and second baseband signals, means for filtering the double reference frequency component of the first and second baseband signals to provide respective I and Q signals, said I and Q signals constituting in rectangular coordinates components of a vector represented in polar coordinates by R and $\theta$, where R is the maximum amplitude of I and Q signals and $\theta$ is the instantaneous angle represented by the arctangent of the I signal divided by the Q signal, means for sampling said I and Q signals at a frequency greater than twice the maximum deviation in frequency of said carrier produced by said modulating signal to obtain a sequence of sets of samples of said I and Q signals, each set of samples being represented by a respective vector R and a respective angle $\theta$ consisting of a first angle component equal to zero or an integral number of octants and a second angle component less than an octant which is added to or subtracted from said first angle component depending on whether the vector R is in an odd or an even octant, means for converting each of said I signal samples into a respective binary number, means for converting each of said Q signal samples into a respective binary number, means for deriving the absolute binary value of each of said binary numbers corresponding to a respective I signal sample, means for deriving the absolute binary value of each of said binary numbers corresponding to a respective Q signal sample, means for deriving from the binary number of an I signal sample, from the binary number of a Q signal sample, and from the relative magnitudes of the absolute values of the binary numbers of said I and Q signal samples of each set of I and Q signal samples a respective first binary number from 000 to 111 representing the first angle component of a respective angle $\theta$, a binary divider having a numerator input, a denominator input, and a quotient output, said binary divider in response to the absolute value of a binary number applied to said numerator input and the absolute value of a binary number applied to said denominator input providing a binary number at said quotient output representing the absolute value of the binary number applied to said numerator input divided by the absolute value of the number applied to said denominator input, selector means for passing the smaller of the absolute binary values of an I signal sample and a Q signal sample of a set of I and Q signal samples to said numerator input of said binary divider and for passing the greater of the absolute binary values of an I signal sample and a Q signal sample of said set of I and Q signal samples to said denominator input of said binary divider whereby at said quotient output of said binary divider is obtained a binary number corresponding to the quotient of said absolute binary numbers of said set of I and Q signal samples, means responsive to each binary number obtained at the quotient output of said divider to provide a respective second binary number representing the second angle component of a respective angle $\theta$, means for combining the first binary number and the second binary number of each of said sets of samples to obtain a respective third binary number representing the respective angle $\theta$ thereof, means for obtaining a sequence of changes in the value of said third binary numbers of successive sets of said sequence of sets of I and Q signal samples, said sequence of changes representing changes in frequency of said carrier from the center frequency thereof corresponding to changes in amplitude of said modulating signal, means for converting each number of said sequence of changes in the value of successive third binary numbers into a respective amplitude level whereby said modulating signal is recovered.

2. The detector of claim 1 in which said selector means comprises comparator means responsive to the absolute binary value of an I signal sample and to the absolute binary value of a Q signal sample of each set of I and Q signal samples for developing a binary 1 when the absolute value of an I signal sample is greater than the absolute value of a Q signal sample and a binary 0 when the absolute value of an I signal sample is not greater than the absolute value of a Q signal sample, means responsive to a binary 1 from said comparator for passing said absolute binary number of an I signal sample to said denominator input of said divider and for passing said absolute binary number of a Q signal sample to said numerator input of said divider whereby at said quotient output is obtained a binary number corresponding to the quotient of said absolute binary numbers of a set of I and Q signal samples, and responsive to a binary O from said comparator for passing said absolute binary number of a I signal sample to said numerator input of said divider and for passing said absolute binary value of a Q signal sample to said denominator input of said divider whereby at said quotient output is obtained a binary number corresponding to the quotient of said binary numbers.

3. The detector of claim 1 in which said means responsive to each binary number obtained at the quotient output of said divider to provide a respective second binary number representing the second angle component of a respective angle $\theta$ is a read only memory.

4. A detector for recovering a modulating signal from a carrier modulated in frequency by the modulating signal comprising:

means for generating first and second signals in phase quadrature and at a reference frequency substantially equal to the center frequency of said carrier, means responsive to said phase-quadrature reference signals for converting the frequency modulated carrier into first and second baseband signals, means for filtering the double reference frequency component of the first and second baseband signals to obtain respective I and Q signals, said I and Q signals constituting in rectangular coordinates the components of a vector represented in polar coordinates by R and $\theta$, where R is the maximum amplitude of I and Q signals and $\theta$ is the instantaneous angle represented by the arctangent of the I signal divided by the Q signal, means for sampling said I and Q signals at a frequency greater than twice the maximum deviation in frequency of said carrier produced by said modulating signal to obtain a sequence of sets of I and Q signal samples, means for deriving from said sequence of set of I and Q signal samples a sequence of binary values of the angle $\theta$, each binary value of the angle $\theta$ corresponding to a respective set of I and Q signal samples, means including an octant number generator for deriving from said sequence of binary values of the angle $\theta$ a sequence of changes in the binary value of the angle $\theta$ of successive sets of said sequence of sets of I and Q signal samples, said sequence of changes in the binary value of the angle $\theta$ representing changes in frequency of said carrier from the center frequency thereof corresponding to changes in amplitude of said modulating signal, whereby said modulating signal is recovered.

5. The detector of claim 4 in which means are provided for converting said sequence of changes in binary values into analog values.

* * * * *